United States Patent [19]

Shishikura et al.

[11] Patent Number: 4,675,868
[45] Date of Patent: Jun. 23, 1987

[54] ERROR CORRECTION SYSTEM FOR DIFFERENCE SET CYCLIC CODE IN A TELETEXT SYSTEM

[75] Inventors: Hirohisa Shishikura; Ichiro Sase; Akio Yanagimachi; Osamu Yamada, all of Tokyo, Japan

[73] Assignees: OKI Electric Industry Co., Ltd.; Nippon Hoso Kyokai, both of Tokyo, Japan

[21] Appl. No.: 716,044

[22] Filed: Mar. 26, 1985

[30] Foreign Application Priority Data

Mar. 30, 1984 [JP] Japan .................................. 59-60914
Mar. 30, 1984 [JP] Japan .................................. 59-60915
Mar. 30, 1984 [JP] Japan .................................. 59-60916

[51] Int. Cl.⁴ ............................................. G06F 11/10
[52] U.S. Cl. ........................................ 371/37; 371/43; 371/36
[58] Field of Search ................. 371/37, 38, 40, 43, 371/44, 36

[56] References Cited

U.S. PATENT DOCUMENTS

| | | | |
|---|---|---|---|
| 3,873,971 | 3/1975 | En ............................................. | 371/43 |
| 4,035,767 | 7/1977 | Chen ....................................... | 371/43 |
| 4,317,202 | 2/1982 | Markwitz ............................... | 371/43 |
| 4,476,458 | 10/1984 | Dollard ................................. | 371/36 |
| 4,555,784 | 11/1985 | Wood ..................................... | 371/37 |
| 4,564,945 | 1/1986 | Glover .................................. | 371/38 |
| 4,597,083 | 6/1986 | Steneison ............................. | 371/37 |

*Primary Examiner*—Michael R. Fleming
*Attorney, Agent, or Firm*—Martin M. Novack

[57] ABSTRACT

An error correction system for a difference set cyclic (272, 190) code with 190 data bits and 82 test bits in a coded transmission teletext system which transmits character information on the vertical blanking interval of a television signal has been improved in peripheral circuits for operating an error correction circuit. A first improvement is to correct only designated packets which are in frame synchronization condition and/or designated by an index register. A second improvement is to handle shortened (L,k) code where L is less than 272, using common hardware. A third improvement is selection of three operational modes of data to be corrected. In the first mode, uncorrected data is supplied by an external circuit, and said uncorrected data is stored temporarily in a buffer memory, and corrected data is stored in said buffer memory again to supply external circuit corrected data. Transfer of data between the buffer memory and the error correction circuit is handled by wired logic hardware apparatus. In a second mode, uncorrected data and corrected data are provided in a buffer memory but no external circuit is concerned in operation of the present system. In a third mode, no buffer memory is used, and an external circuit supplies uncorrected data to an error correction circuit directly and receives corrected data directly from the error correction circuit.

12 Claims, 16 Drawing Figures

Fig. 8

| ADDRESS | STORED DATA |
|---|---|
| 0 ≀ 63 | FIRST PACKET |
| 64 ≀ 127 | SECOND PACKET |
| 128 ≀ 191 | THIRD PACKET |
| 640 ≀ 703 | 11'TH PACKET |
| 704 ≀ 767 | 12'TH PACKET |
| 768 ≀ 1023 | NOT USED |

Fig. 9

| ADDRESS | STORED DATA | |
|---|---|---|
| 1024 | ERROR INFORMATION | FIRST PACKET |
| 1025 ∽ 1087 | 24 BYTES | |
| 1088 | ERROR INFORMATION | SECOND PACKET |
| 1089 ∽ 1151 | 24 BYTES | |
| 1152 | ERROR INFORMATION | THIRD PACKET |
| 1153 ∽ 1215 | 24 BYTES | |
| ... | ... | |
| 1664 | ERROR INFORMATION | 11'TH PACKET |
| 1665 ∽ 1727 | 24 BYTES | |
| 1728 | ERROR INFORMATION | 12'TH PACKET |
| 1729 ∽ 1791 | 24 BYTES | |
| 1792 ∽ 2047 | NOT USED | |

ERROR CORRECTION SYSTEM FOR DIFFERENCE SET CYCLIC CODE IN A TELETEXT SYSTEM

BACKGROUND OF THE INVENTION

The present invention relates to a character multiplexed television transmission system which transmits character information by multiplexing the character signal in a vertical retrace blanking period, in particular, the present invention relates to such a system which transmits coded digital character information with a digital error correction facility.

An error correction system for a character multiplex television transmission (teletext) system which uses coded digital signal has been known in the Japanese patent application Nos. 6579/83, 54002/83, and 90017/83, (Japanese laid open publication Nos. 133751/84, 181841/84 and 216388/84, respectively), which use a packet with 272 bits having 190 data bits and 82 parity bits.

FIG. 1 shows a brief block diagram of such a prior system, in which the numeral 1 is a bus coupled to a CPU (central processing unit), and said bus line 1 is coupled to the output port 2 and the input port 3. The output port 2 supplies the uncorrected data 5 to the error correction circuit 4, which includes a parallel-serial converter, a serial-parallel converter, a syndrome register, a data register, and a majority circuit to correct errors of said (272, 190) codes. The error correction circuit 4 supplies the corrected data 6 and the ready signal 10 to the input port 3. The error correction circuit 4 receives from the CPU, the start signal 7, the load signal 8, the correct signal 9 through the output port 2.

In FIG. 1, the CPU supplies the start signal 7 to the error correction circuit 4, before the error correction operation, so that the syndrome register in the circuit 4 is initiated. Then, the predetermined number of bits (8 bits, or 16 bits) of uncorrected data is supplied to the error correction circuit 4 by the CPU through the bus line 1 and the output port. The load signal 8 is also supplied to the error correction circuit 4 by the CPU for every supply of 8 bits or 16 bits of uncorrected data to the error correction circuit 4. The error correction circuit 4 converts first the input data (8 bits or 16 bits) which is in parallel form to a serial form, then, the serial data is stored in the data register and the syndrome register (not shown). Therefore, 34 times of transfer operation is requested to transfer a single packet which has 272 bits when an 8 bits CPU is used (when 16 bits CPU is used, 17 times of transfer operation is requested). When 272 bits of data is transferred into the syndrome register in the error correction circuit 4, a syndrome is obtained. Then, the CPU supplies the correct signal to the error correction circuit 4 through the bus line 1 and the output port 2, and the error correction circuit 4 corrects an error or errors of data, then, the corrected data (8 bits or 16 bits) returns to the CPU through the serial-parallel conversion, the input port 3, and the bus line 1. When 34 times of return operation finishes (8 bits CPU), the correction of 272 bits finishes.

The ready signal 10 informs the CPU if the CPU may load the uncorrected 8 bits data (or 16 bit data) to the error correction circuit, or the CPU may read the corrected 8 bits data (or 16 bits data).

The structure of FIG. 1 has the advantage that the circuit structure is simple and the error correction of (272, 190) code is performed in memory mapped I/O format, however, it has the disadvantage that the CPU must write and/or read data in the error correction circuit 4, so the load on the CPU is heavy.

It should be noted that up to 12 packets are mounted in each vertical blanking period in the Japanese character transmission television (teletext) system. Therefore, the time requested for error correction is;

34 bytes×2×12 packets=816 bytestime where 1 byte has 8 bits. Further, the time for providing a load instruction, providing a correct instruction, testing a ready signal is requested, and this all adds to the load on the CPU. That heavy work of a CPU can disturb other jobs of a CPU, including decoding characters, and/or displaying characters.

SUMMARY OF THE INVENTION

It is an object, therefore, of the present invention to overcome the disadvantages and limitations of a prior character multiplexed television transmission (teletext) system by providing a new and improved character transmission system.

Another object of the present invention is to provide an error correction system in a teletext system in which only a designated packet is corrected.

Still another object of the present invention is to provide an error correction system in a teletext in which data length is variable.

Still another object of the present invention is to provide an error correction system in a teletext system in which data transfer between an external circuit and an error correction circuit may be selected among some operational modes so that a common LSI may be used for all the operational modes.

According to one of the features of the present invention, an error correction system for difference set cyclic code comprises an error correction circuit having at least a syndrome register, a data register and a majority circuit to correct an error or errors in a packet; and an index register for storing information as to whether a packet is corrected or not so that only a packet with a correction flag in said index register is applied to said error correction circuit.

Preferably, a detection means for detection if frame synchronization for each input packet is established or not is provided, so that only a packet in synchronized status is subject to error correction.

Preferably, the bit length of said data register is adjustable so that variable length data may be corrected.

Still preferably, transfer of uncorrected data and corrected data between an external circuit and an error correction circuit is selected among three operational modes, so that a single LSI is used for all the operational modes. In a first mode, uncorrected data is supplied by an external circuit, and said uncorrected data is stored temporarily in a buffer memory, and corrected data is stored in said buffer memory again to supply an external circuit corrected data. Transfer of data between the buffer memory and the error correction circuit is handled by wired logic hardware means. In a second mode, uncorrected data and corrected data are provided in a buffer memory but no external circuit is involved in operation of the present system. In a third mode, no buffer memory is used, and an external circuit supplies uncorrected data to an error correction circuit directly and receives corrected data directly from the error correction circuit.

BRIEF DESCRIPTION OF THE DRAWINGS

The foregoing and other objects, features, and attendant advantages of the present invention will be appreciated as the same become better understood by means of the following description and accompanying drawings wherein;

FIG. 8 is a memory map of a buffer memory which stores uncorrected data, FIG. 9 is a memory map of a buffer memory which stores corrected data.

DESCRIPTION OF THE PREFERRED EMBODIMENTS

Figure 1:
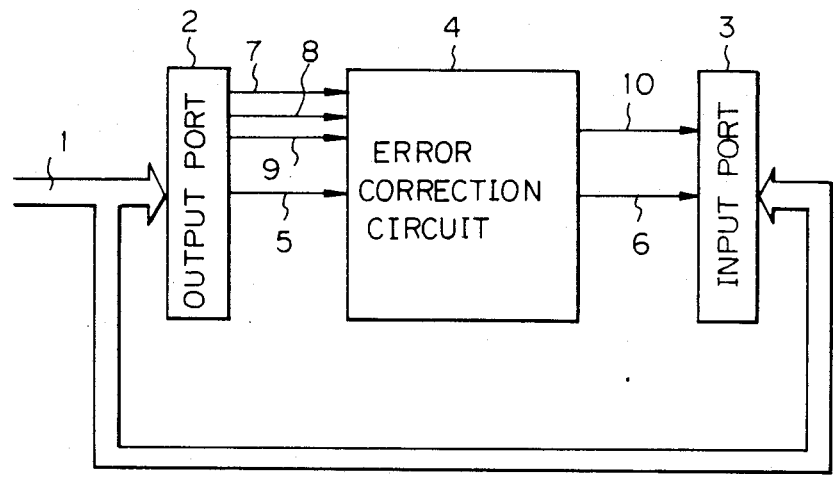
FIG. 1 is a block diagram of a prior error correction circuit.
Figure 2:
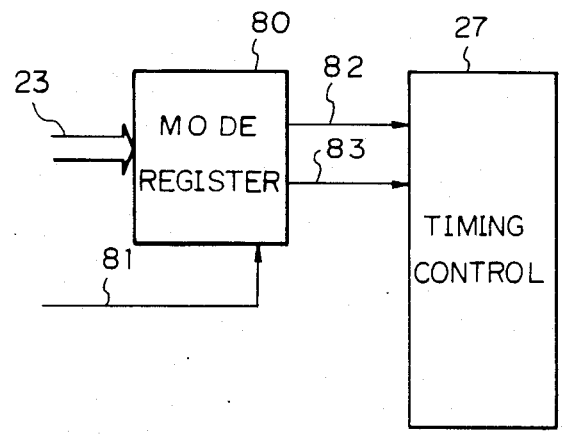
FIG. 2 is an explanatory drawing for switching operation modes.

FIG. 2 shows the mode designation circuit for switching three operation modes in the present invention. In FIG. 2, the numeral 23 is a local data bus, 81 is a mode register write signal provided by the CPU (not shown), 80 is a mode register, 82 is a second mode designation signal (second embodiment) 83 is a third mode designation signal (third embodiment), and 27 is a timing control circuit.

First, the CPU provides the data of the operation mode to the local data bus 23, and said data on the bus 23 is written in the mode register 80 by the mode register write signal 81. That data has, for instance, the zero'th bit for the second mode designation signal 82, and the next bit for the third mode designation signal 83. For instance, when the second mode is designated (second embodiment), the CPU provides the data "1,0,0,0,0,0,0,0" to the bus, and the mode register write signal 81, then, the second mode designation signal 82 is provided to the timing control circuit 27.

When the first operation mode (first embodiment) is designated, the data written in the mode register 80 is "0,0,0,0,0,0,0,0". When both the second mode designation signal 82 and the third mode designation signal 83 are zero, it is recognized that the first mode is designated.

When the third mode is designated, the data "0,1,0,0,0,0,0,0" is stored in the mode register 80.

Then, each mode is described in accordance with the figures.

Figure 3:
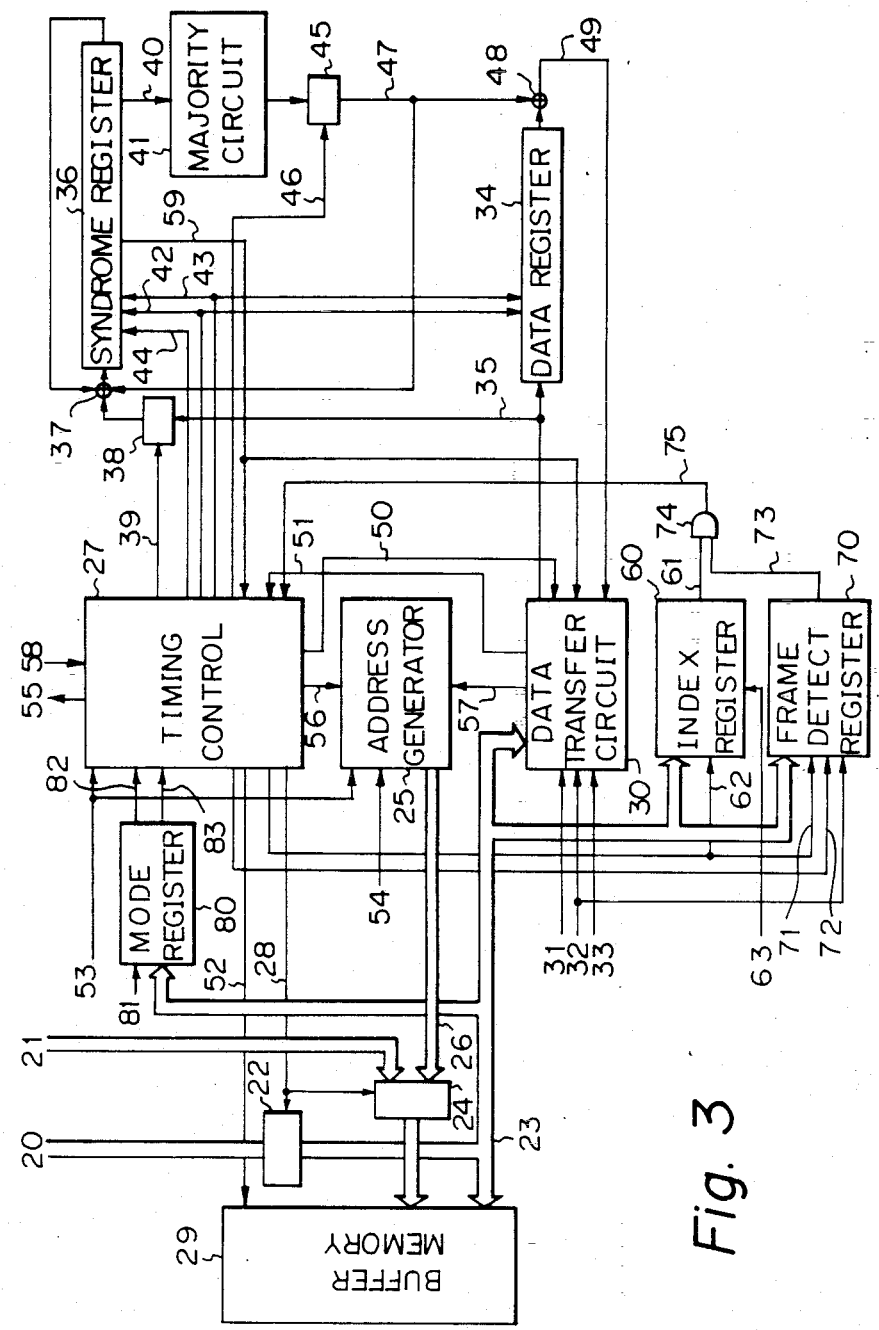
FIG. 3 is a block diagram of a first embodiment of the present invention.

FIG. 3 shows a block diagram of the first embodiment of the present invention, relating to the first operation mode. In the figure, the numeral 20 is a data bus of a CPU (not shown), and 21 is an address bus of a CPU. The data bus 20 of the CPU is coupled with the first input/output terminal of the data bus control circuit 22, the second input/output terminal of which is coupled with the local data bus 23.

The address bus 21 of the CPU is coupled with the first input terminal of the address switching circuit 24, the second input terminal of which receives the automatic address signal 26 from the address generator 25. The address switching circuit 24 selects one of address signal from CPU on the first input terminal, and the automatic address signal 26 on the second input terminal accoding to the bus control signal 28 from the timing control 27, and the output of the same is applied to the address input terminal of the buffer memory 29 as the memory address signal.

The local data bus 23 is coupled with the input/output terminal of the buffer memory 29, and the data input/output terminal of the data transfer circuit 30, and therefore, the data transfer among the CPU, the buffer memory, and the data transfer circuit is possible.

The data transfer circuit 30 receives the serial reception data 31 which is a packet reception data received by a character code receiver (not shown), the framing detection signal 32 which shows the establishment of the frame synchronization, and the synchronization clock 33 which is synchronized with the clock signal (clock-run-in).

Figure 10:
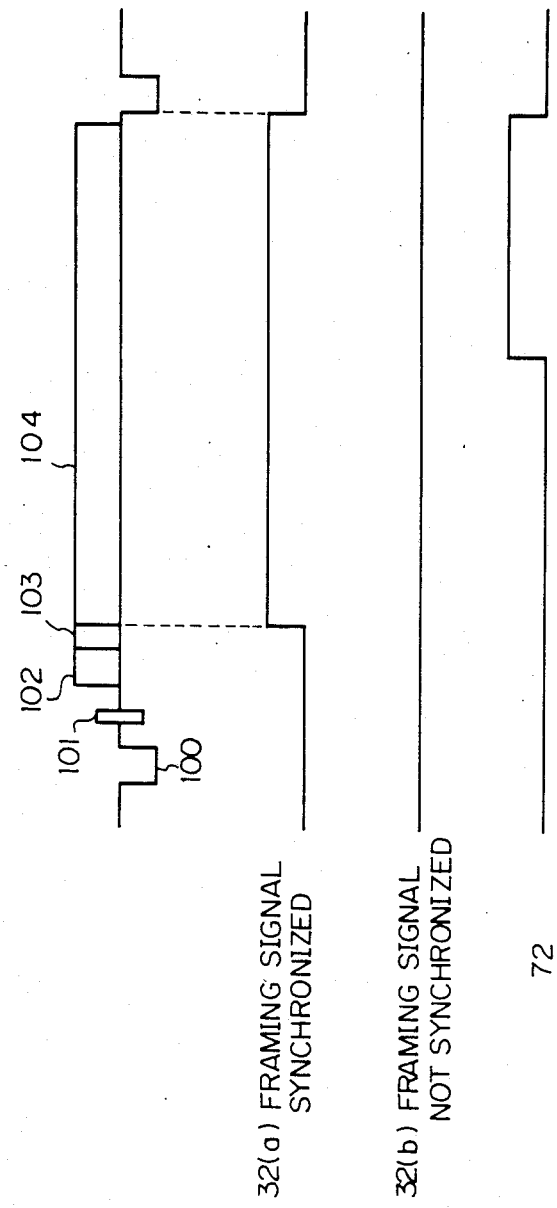
FIG. 10 is a timing sequence showing the operation of FIG. 3.

The data register 34 is a shift register for storing 272 bits of reception packet, or 190 bits of data in said 272 bits of reception packet. The data register 34 receives the uncorrected data 35 from the data transfer circuit 30 which carries out the parallel-serial conversion. The syndrome register 36 is shown in FIG. 10 of the Japanese patent application No. 6579/83, and has 82 bits of capacity and a feedback loop with an adder 37 of the modulo 2. The numeral 38 is a load gate circuit, which decides if the uncorrected signal 35 is applied to the syndrome register 36 through the adder 37, according to the load gate signal 39 from the timing control 27.

The numeral 40 is a syndrome register signal, 41 is a majority circuit, 42 is a load clock signal for loading data to the syndrome register and the data register 34, 43 is a correction clock signal, 44 is a clear signal for clearing the syndrome register 36, 45 is a correct gate circuit, which decides whether the output of the majority circuit 41 is applied to the adders 37 and 48 as the error correction signal, according to the correct gate signal 46.

The numeral 49 is corrected data, 50 is a clock signal for serial-parallel conversion, and parallel-serial conversion, 51 is a write pulse signal for writing reception data into the buffer memory 29, 52 is a write pulse signal for writing into the buffer memory 29.

The numeral 53 is a vertical blanking signal, 54 is a horizontal synchronization signal or horizontal retrace signal, and 55 is a status signal which shows the operation of the apparatus. The numerals 56 and 57 are address update signals, 58 is a data request signal of the CPU.

Said local data bus 23 is coupled with the index register 60, whch also receives the write pulse signal 63 from the CPU and the index register shift clock 62 from the timing control 27, and said index register 60 provides the correction index signal 61. The local data bus 23 is also coupled with the output of the framing detection register 70. The numeral 72 is a shift clock for supplying the framing detection signal 32 to the framing detection register 70.

The numeral 73 is a correction index signal, 74 is a gate for providing a correction index signal 75 by the logical product of the correction index signal 61 from the index register 60 and the correction index signal 73 from the framing detection register 70. The correction index signal 75 is applied to the timing control 27.

The numeral 80 is a mode register, 81 is a mode register write signal, 82 is a second mode (second embodiment) designation signal, 83 is a third mode (third embodiment) designation signal. The first mode (first embodiment) is designated when both the signals 82 and 83 are in zero state.

The operation of FIG. 3 is described below.

The operation of FIG. 3 comprises the four operations; (1) to perform serial-parallel conversion for reception serial data, and to write converted data (uncorrected data) into the buffer memory; (2) to read uncorrected data in the buffer memory, and load the same to the data register and the syndrome register; (3) to correct errors by circulating the data register and the syndrome register; and (4) to write the corrected data into the buffer memory. Finally, the CPU reads out the corrected data in the buffer memory.

Figure 4:
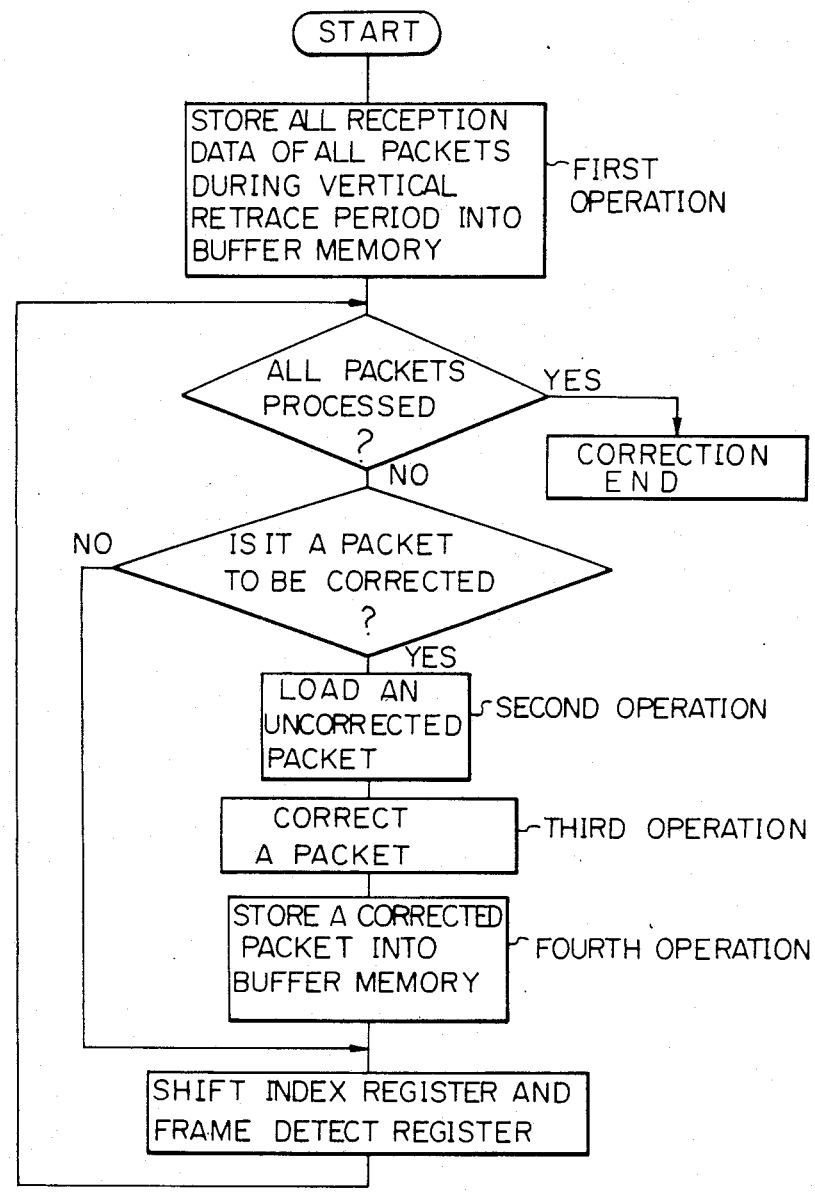
FIG. 4 is a flowchart showing the operation of FIG. 3.

The general flowdiagram of the above operation is shown in FIG. 4. As for the first operation (1), the reception data of all the packets on a vertical blanking period is stored in the buffer memory. The operations (2), (3) and (4) are performed for each packet, after the packet is recognized to be corrected. The index register 60 and the framing detection register 70 provide an index which shows whether the packet must be corrected or not, as will be described.

When the packet is recognized to be corrected, said operations (2), (3) and (4) are carried out. On the other hand, when the packet is not to be corrected, those operations are skipped, and next packet is searched.

When all the packets to be corrected are corrected, and stored in the buffer memory, the status signal 55 which indicates the end of the operation is applied to the CPU to inform the same that the buffer memory is ready to be read out.

Figure 5:
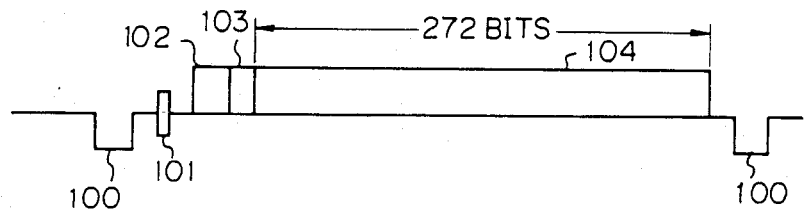
FIG. 5 shows a timing sequence of a packet reception data in a character code broadcast.

FIG. 5 shows the timing of a reception packet data in a character code broadcast for the explanation of the first operation. In FIG. 5, the numeral 100 is a horizontal synchronization signal, 101 is a color burst signal, 102 is 16 bits of clock-run-in, 103 is a framing signal for frame synchronization, 104 is 272 bits of reception data to provide serial reception data 31.

The data transfer circuit 30 may recognize the beginning of the serial reception data by receiving the framing detection signal 32 which shows the establishment of the synchronization by the framing signal 103. Also, it receives the synchronized clock 33 synchronized by the clock-run-in 102, therefore, it performs the serial-parallel conversion by taking the reception serial data 31 according to the synchronization clock 33 during the 272 bits of data bits interval. When the capacity of the local data bus 23 is 8 bits, the converted parallel data is applied to the local data bus every when 8 bits of serial reception data are obtained. The write pulse signal 51 is supplied to the buffer memory as the write pulse signal 52 through the timing control 27, just when the data is sent to the local data bus 23. When the write operation finishes, the data transfer circuit 30 provides the address update signal 57 to the address generation circuit 25, and the automatic address signal is incremented like ($\alpha$), ($\alpha+1$), ($\alpha+2$) et al. The beginning of the automatic address signal for the particular packet is determined automatically, and FIG. 8 shows an example.

In the first operation mode, the data bus control circuit 22 separates the CPU data bus 20 from the local data bus 23, and the address switching circuit 24 selects the automatic address signal 26 from the address generation circuit 25, and the output of the circuit 24 is applied to the address input of the buffer memory 29.

Thus, the serial reception data 31 having 272 bits in a packet is carried out the serial-parallel conversion, and the converted data is written in the buffer memory starting the address ($\alpha$).

Figure 6:
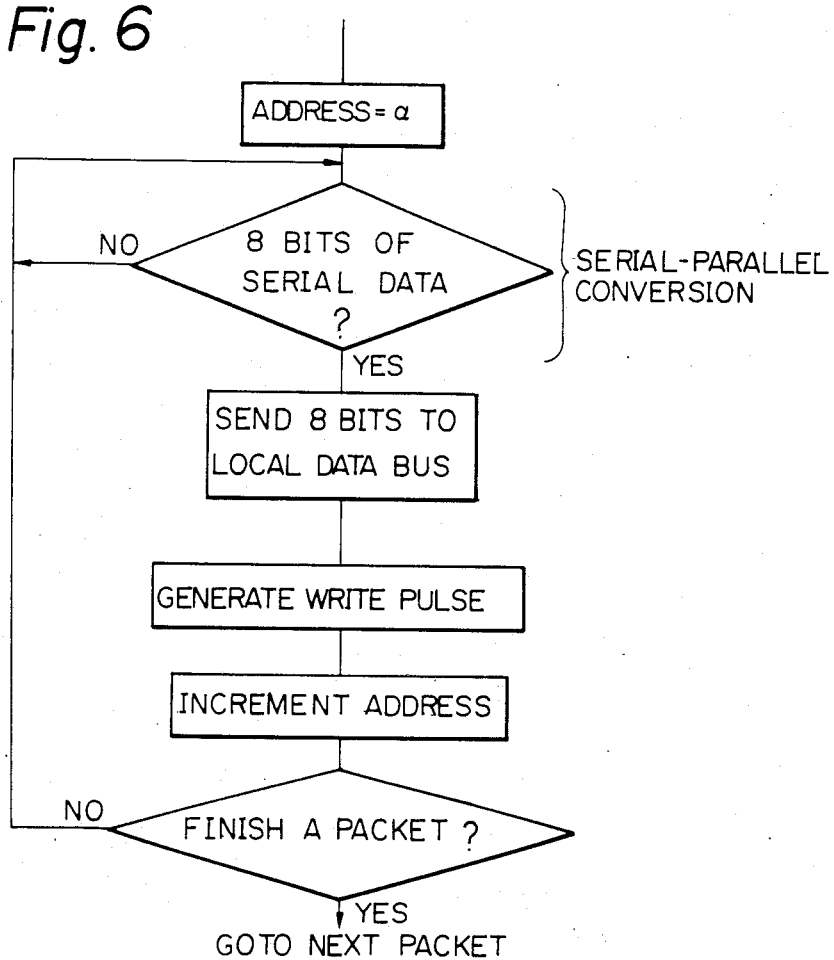
FIG. 6 is a flowchart showing the operation of FIG. 3.

FIG. 6 shows the flowdiagram for storing a packet of reception data in the buffer memory 29. When the process is carried out for each byte (=8 bits), 34 times (=272/8) of repetition is requested for the process of one packet, and the address of the buffer memory is ($\alpha$) through ($\alpha+33$).

Figure 7:
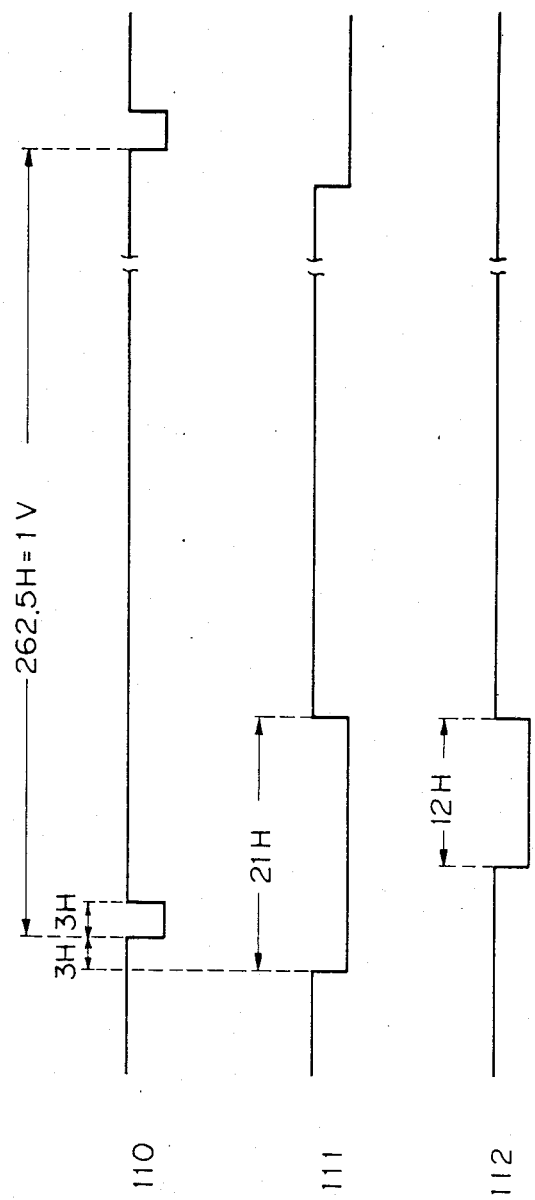
FIG. 7 shows a timing sequence of the operation of FIG. 3.

In the Japanese character code multiplexed television broadcast (coded transmission teletext) system, the up to 12 packets are inserted in each vertical blanking interval as shown in FIG. 7 in which the numeral 110 is a vertical synchronization signal, 111 is a vertical blanking signal, 112 is a signal derived by said signal 111, and is composed of the rear part 12H of the vertical blanking interval 21H, where H shows a horizontal scanning time. The data is transmitted when the signal 112 is in L state, that is to say, the rear 12H duration of the vertical blanking interval.

The numeral 53 in FIG. 3 is for instance the signal 112. The address generator circuit 25 counts the horizontal synchronization signal 54 when the signal 112 is in L state, to provide a partial signal of an automatic address signal. Accordingly, when the data transfer for a packet is finished, next horizontal synchronization signal 54 comes, therefore, by counting the same, the address is switched to the address for the store of the next packet. Similarly, the operation of FIG. 6 is repeated by 12 times, to store the 12 packets of uncorrected data into the buffer memory 29.

The framing detection signal 32 is taken into the framing detection register 70 by the detection shift clock 72, so that the framing detection signal 32 is not provided when the signal 112 is in L state (it shows that no data exists, or the frame synchronization is not established).

FIG. 10 shows the relationship between the framing detection signal 32 and the detection shift clock 72. In FIG. 10, the numerals 100 through 104 show the same signals as those in FIG. 5. The numeral 32a is the framing detection signal when the synchronization by the framing signal is established, and it changes the level from L to H at the rear point of the framing signal 103, and the signal "1" is read by the detection shift clock 72. The numeral 32b is the framing detection signal when no synchronization is established, and the level holds L, and the signal "0" is read to the framing detection register 70 by the detection shift clock 72.

The framing detection register 70 is a 12 bits shift register, and each bit relates to a packet number. Also, the packet number and the memory area for storing the uncorrected data relate to each other. The relations between the bits of the framing detection register 70, the packet number, and the buffer memory area are shown in FIG. 8.

Although 34 addresses are enough for storing a packet, 64 addresses are kept in FIG. 8 for the simple configuration of the address generation circuit. Therefore, the rear 30 addresses among the 64 data area are not used. When 12 packets are written, the signals 111 and 112 in FIG. 7 change from L status to H status, and then, the first operation finishes.

The second operation begins when the vertical blanking signal 111 or 112 changes from L status to H status. The CPU sets the signal to the index register 60 designating the packet to be corrected, before the second operation. Therefore, the CPU provides the 8 bits of the set data through the CPU data bus 20, the data bus control circuit 22 (the bus control signal 28 couples the CPU data bus with the local data bus 23 before the first operation), and said 8 bits data is written into the index register 60 by the write pulse 63 from the CPU. When the index register has 12 bits, the set of the index register is accomplished in two operations.

Accordingly, the signal 75 which is the logical product of the serial output 61 of the index register 60 and the serial output 73 of the framing detection register 70 indicates if the packet is to be corrected or not. The timing control 27 does not enter into the correction operation (second operation, third operation, and fourth operation) if the correction index signal 75 is "zero", but the contents of the index register 60 and the framing detection register 70 are shifted by the index shift clock 62 and the detection shift clock 71, respectively, and the address update signal 56 is applied to the address generation circuit. Thus, the address is updated to the start address for the next packet. When the correction index signal is "1", the second, the third, and the fourth operations begin.

In the second operation, the data bus control circuit 22 in FIG. 3 separates the buses 20 and 23, and the address switching circuit 24 selects the automatic address signal 26 which is provided by the address generation circuit 25 and applies the same to the input of the buffer memory 29.

In the second operation, the uncorrected data stored in the buffer memory 29 as shown in FIG. 8 is read out for every 8 bits. The uncorrected data 35 is applied to the first input of the adder 37 through the load gate circuit 38, and the input of the data register 34, after the parallel-serial conversion in the data transfer circuit 30. The one packet data (=272 bits) is parallel-serial converted by 34 times (8×34=272), and the serial data is applied to the data register 34 and the syndrome register 36. The timing control 27 provides an address update signal 56 for each reading, and the content of the address generation circuit is incremented for each reading.

The error correction is accomplished by the syndrome thus obtained.

When the second operation finishes, and the data register 34 and the syndrome register 36 are loaded, the operation is switched to the third operation automatically.

In the third operation, the timing control 27 provides the correction clock signal 43 so that the data register 34 and the syndrome register 36 are shifted. Also, the load gate circuit 38 becomes OFF, and the correct gate circuit 45 becomes ON. The error correction is accomplished in the exclusive-OR circuit 48 (an adder with the modulo-2). The error correction signal 47 is the output of the majority circuit 41 of the 17 signals, which are the 17 linear combination of 82 signals in the syndrome register. The error correction signal passes only in the error correction operation, responsive to the correct gate signal 46. The error correction signal 47 corrects the syndrome register 36 so that the error is removed, when there is an error of a bit. The corrected data 49 is fed back to the data input of the data register 34.

The syndrome register 36 is shifted by one bit before the error correction, because the (272, 190) code is selected instead of the (273, 191) code.

When 272 bits of shifts (273 bits of shifts in the syndrome register) finish, the packet with 272 bits are recovered, and the third operation finishes.

The error correction scheme of the present invention is substantially the same as that described in the Japanese patent application No. 6579/83.

The fourth operation begins when the third operation finishes. In the fourth operation, the corrected data is stored in the buffer memory after the serial-parallel conversion. Before the send of the corrected data, the error status signal 59 is sent to the local data bus 23, and is stored in the first address of the area which stores the corrected packet in the buffer memory 29. Then, the 272 bits of corrected data are sent. In that case, as no parity bit is necessary for the corrected data, only the 190 bits of information data are stored in the buffer memory 29, but the 82 bits of parity bits are removed. As the error correct signal is stopped by the correct gate signal 46 in the fourth operation, the corrected data stored in the data register 34 is applied to the data transfer circuit 30 as the corrected data 49, and is stored in the buffer memory 29 through the serial-parallel conversion, and the local data bus 23.

Thus, 25 bytes of data consisting of 24 bytes of a packet data (190 bits), and one byte of error status signal 59 are stored. The timing control 27 provides the write pulse 52 and the automatic address signal 26 to the buffer memory 29, for each byte of transmission. Then, the address update signal 56 is applied to the address generation circuit 30 to update the automatic address signal 26. The address selection signal 24 selects the automatic address signal 26 which is applied to the buffer memory 29 in the fourth operation. The data bus control circuit 22 separates 20 from 23 in the fourth operation.

As described above, the second, the third, and the fourth operation are a series operation for a single packet. When the series operation finishes, the index register 60 and the framing detection register 70 are shifted, and the automatic address of the address generation circuit 25 is updated to the address of the next packet. The correction index signal 75 determines if the next packet is to be corrected or not. If the correction index signal 75 is "0", no correction is performed, and the index register 60 and the framing detection register 70 are further shifted by one bit, and the automatic address signal 26 is updated to the address of the next packet. Then, the correction index signal 75 for the next packet is tested. When the correction index signal 75 is "1", the second, the third, and the fourth operations described above are accomplished. Similarly, when 12 packets of correction finishes, the correction operation for a single vertical blanking interval finishes.

Thus, the buffer memory 29 has the corrected data in the corrected data area as shown in FIG. 9. It should be noted in FIG. 9 that only 25 bytes of area is occupied although 64 bytes of area is prepared for each packet.

When all the packets are corrected, the timing control 27 in FIG. 3 provides the status signal 55 to inform the CPU that the buffer memory 29 is ready to be read out.

The fifth operation performs that the CPU detects the status signal 55 and reads out the buffer memory. The CPU applies the data request signal 58 to the timing control 27. Then, the timing control 27 couples the CPU data bus 20 with the local data bus 23, and provides the bus control signal 28 so that the automatic address signal 26 is stopped and the address bus signal 21 of the CPU is applied to the buffer memory 29. Then, the CPU may read the buffer memory 29 through the local data bus 23 and the CPU data bus 20.

As described above in detail, in the first embodiment, the CPU has only to set the index register at the beginning of the operation to obtain the corrected data.

Figure 11:
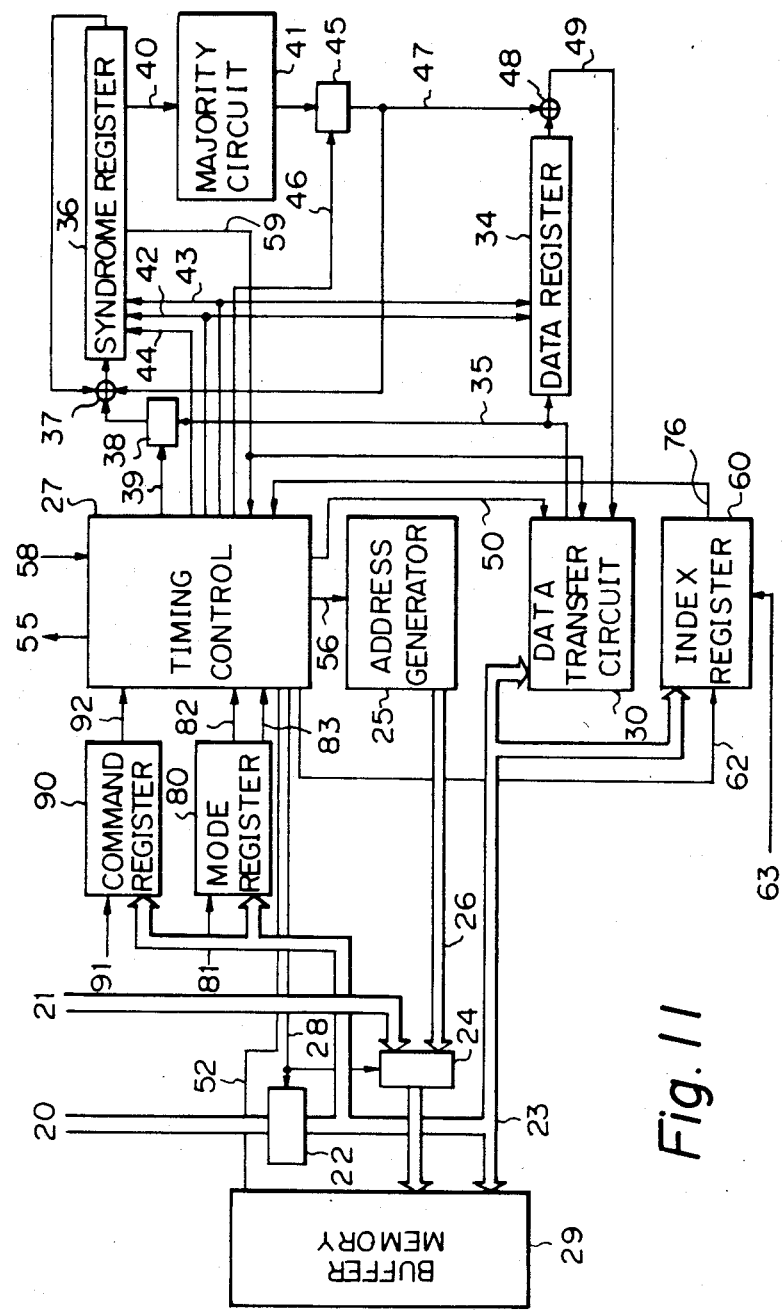
FIG. 11 is a block diagram of a second embodiment of the present invention.

FIG. 11 shows a block diagram of the second embodiment of the present invention. The numerals 20 through 74 in FIG. 11 are the same as those of the same numerals in FIG. 3. The numeral 76 is the correction index signal which is obtained directly at the output of the index register 60. The numerals 80 through 83 are the same as those in FIGS. 2 and 3. The mode register 80 is set beforehand so that the signal 82 is "1", and the signal 83 is "0" when the second operation mode is carried out. The numeral 90 is a command register, 91 is a command register write signal, and 92 is a correction start signal.

In the second embodiment of FIG. 11, the CPU performs the store operation of the uncorrected data into the buffer memory 29, and the input of the correction start signal, although those operations are performed by hardware construction in the previous embodiment.

The operation that the CPU stores the uncorrected data into the buffer memory 29 is called the sixth operation.

In the sixth operation, the data bus control circuit 22 couples the local data bus 23 with the CPU data bus, the address switching circuit 24 stops the automatic address signal 26 from the address generation circuit 25, and the signal on the CPU address bus 21 is applied to the buffer memory 29 by the bus control signal 28.

Accordingly, the CPU may write the buffer memory 29 by the number of packets to be corrected. The address of the store is shown in FIG. 8, and the packet data to be corrected is provided to the error correction circuit by supplying the index register 60 the number of packets relating to the address of the buffer memory 29 which stores the uncorrected data.

The CPU stores the uncorrected data into the buffer memory 29, and sets the index register 60 by the packet data to be corrected. Then, the CPU provides the signal to the CPU data bus 20 and the local data bus 23, and sets the correction start signal 92 into the command register 90 by the command register write signal 91. Upon receipt of the correction start signal 92 from the command register 90, the timing control 27 provides the bus control signal 28 so that the data bus control circuit 22 separates the CPU data bus 20 from the local data bus 23, and the address switching circuit 23 provides the automatic address signal 26 from the address generation circuit 25 to the buffer memory 29. Then, the sixth operation finishes, and by testing the correction index signal 76, the second, the third, the fourth, and the fifth operations are performed, as in the case of the first embodiment.

As described above, the features of the second embodiment are that the CPU writes the uncorrected data into the buffer memory 29, writes the packet data to be corrected in the index register 60, and controls the timing of the correction start.

Figure 12:
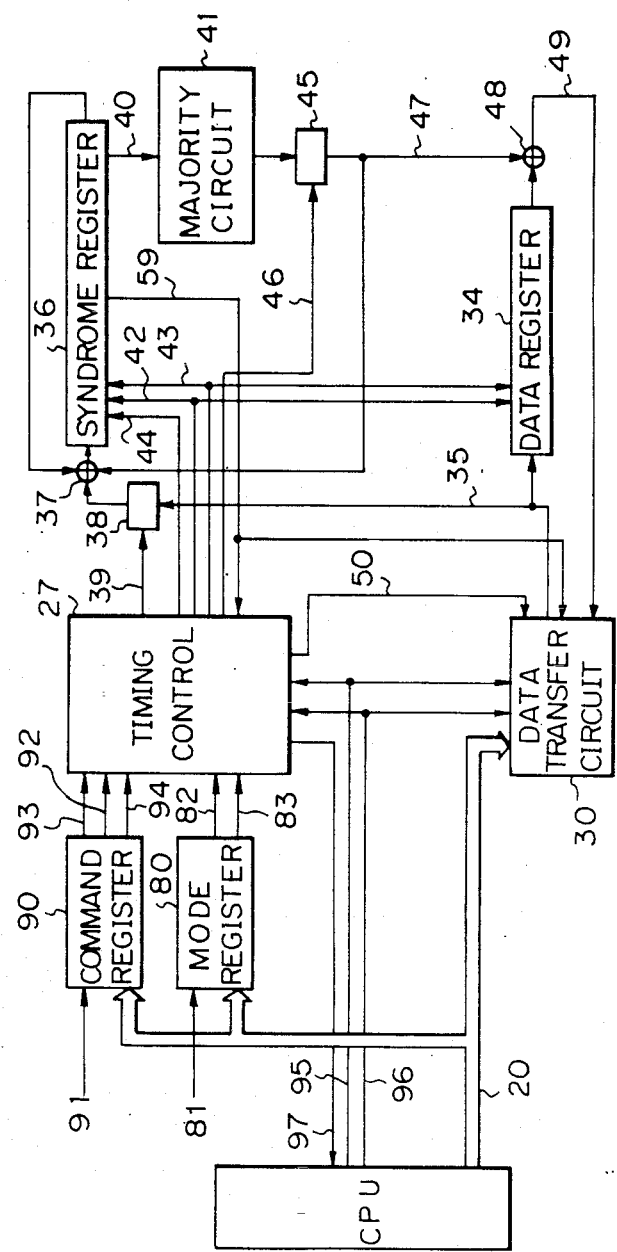
FIG. 12 is a block diagram of a third embodiment of the present invention.

FIG. 12 is a block diagram of the third embodiment of the present invention. The feature of the third embodiment is that the CPU writes a packet of data in the error correction circuit to perform the error correction operation, and reads the corrected packet data directly. Thus, the correction operation is directly controlled by the CPU.

In FIG. 12, the numeral 93 is a load start signal for beginning the data write into the error correction circuit, 94 is the read start signal for beginning of the read of the corrected data into the CPU, and 83 is the mode 3 designation signal showing the third operation. The numeral 95 is the data write signal from the CPU, 96 is the data read signal from the CPU, and 97 is the ready signal. Other numerals in FIG. 12 are the same as those in FIGS. 2, 3 and 11.

The operation of FIG. 12 is as follows.

First, the CPU provides the data on the CPU data bus 20 so that the mode 3 is designated, and sets the mode register 80 by the mode register write signal 81. The mode register 80 provides the mode 3 designation signal 83 to the timing control 27, to enter the third operation.

The CPU sets the load start signal in the command register 90, before the start of the write of the uncorrected data. Upon receipt of the load start signal 93 to the timing control 27 from the command register 90, the timing control 27 provides the syndrome register reset signal 44, and is in the status waiting the data write by the CPU, and the ready signal 97 is output.

When the ready signal 97 is output, the CPU outputs one byte (=8 bits) of uncorrected data to the CPU data bus 20, and sets the data transfer circuit 30 by the data write signal 95.

The data write signal 95 is also applied to the timing control 27, which provides the load clock signal 42 so that the uncorrected data 35 which is parallel-serial converted in the data transfer circuit 30 is applied to the data register 34 and the first input of the adder 37 through the load gate circuit 38.

The CPU loads the data register 34 and the syndrome register 36 through the parallel-serial conversion of 272 bits by repeating 34 times of write operations of the uncorrected data of 8 bits.

Upon completion of the 34 times of write operations of 8 bits, the CPU provides the correction start data on the CPU data bus 20, and sets the command register 90 by the command register write signal 91. When the correction start signal 92 is applied to the timing control 27 from the command register 90, the correction operation begins. The correction operation is the same as the third operation in the first embodiment. Upon completion of the correction, the ready signal is output so that the CPU recognizes the completion of the error correction operation.

The CPU may recognize whether all the errors are corrected by reading the error status signal 59 through the data tranfer circuit 30. When all the errors are corrected, the next operation for reading the corrected data is accomplished. When there is an error remaining, the corrected data is not read out.

In the operation of the reading of the corrected data, the CPU provides the read start signal to the command register 90 through the data bus 20. When the read start signal 94 is applied to the timing control 27, the timing control 27 provides the load clock signal 42 to transfer the corrected data in the data register 34 to the data transfer circuit 30, and output the ready signal 97.

When the ready signal 97 is output, the CPU provides the data read signal 96 to read the 8 bits data through the data bus 20 from the data transfer circuit which performs the serial-parallel conversion.

The data read signal 96 is further applied to the timing control, which sends the corrected data again to the data transfer circuit 30 from the data register 34, and outputs the ready signal 97.

The third embodiment finishes when the CPU reads out 24 times to read all the 190 bits of data.

One of the operation modes of FIG. 3, FIG. 11 and FIG. 12 may be selected according to the number of packets, and the transmission system of character codes. Of course, a single common LSI (large scale integrated circuit) is used for all three operation modes.

Now, some modifications of the present invention are described in accordance with FIGS. 13 through 16, in which a short data less than 272 bits can be handled using the data register 34 with 272 bits.

Figure 13:
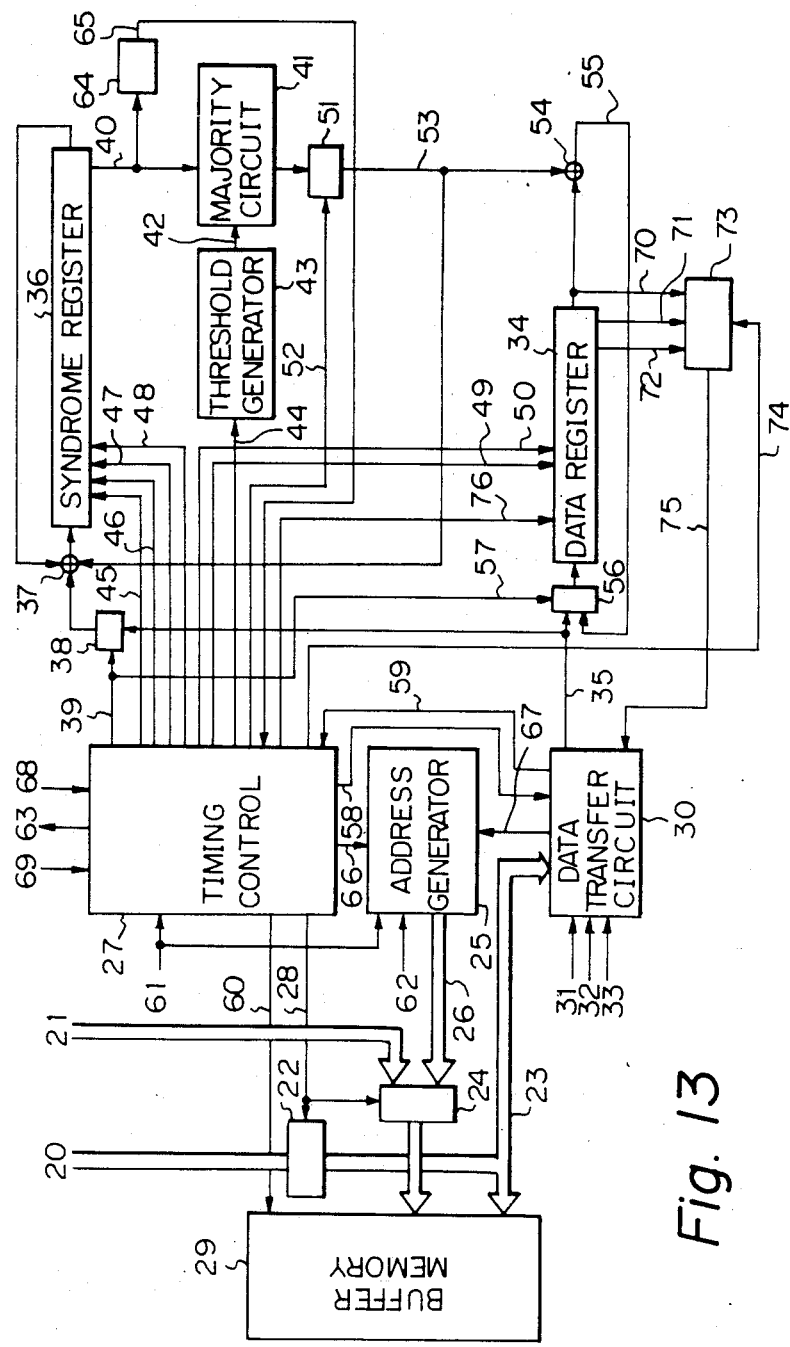
FIG. 13 is a block diagram of still another embodiment of the present invention.

The main portion of FIG. 13 is the same as that of FIG. 3, and the numeral 42 in FIG. 13 is a threshold signal for providing a threshold value for a majority circuit 41, 43 is a threshold generator, 44 is a threshold clock for updating a threshold value.

In FIG. 13, the 69 is a shortened bit number designation signal for designating the number of reduction of bits from (272, 190) code, 70 is a first correction end data, 71 is a second correction end data, 72 is a third correction end data, 73 is an output data selection circuit which applies a correction output data 75 to the data transfer circuit 30 by selecting one of 70, 71 and 72 according to the output data selection signal 74 from the timing control 27.

When the data register 34 has 190 bits, 70 is the 190'th output signal of the data register 34, 71 is the $(190-n_1)$'th output signal, and 72 is the $(190-n_2)$'th output signal, where $n_1$ and $n_2$ relate to number of shortened bits.

The embodiment of FIG. 13 takes an output from the designated bit position of the data register 34, so that a shortened data is corrected and the corrected data in stored in the buffer memory.

Figure 14:
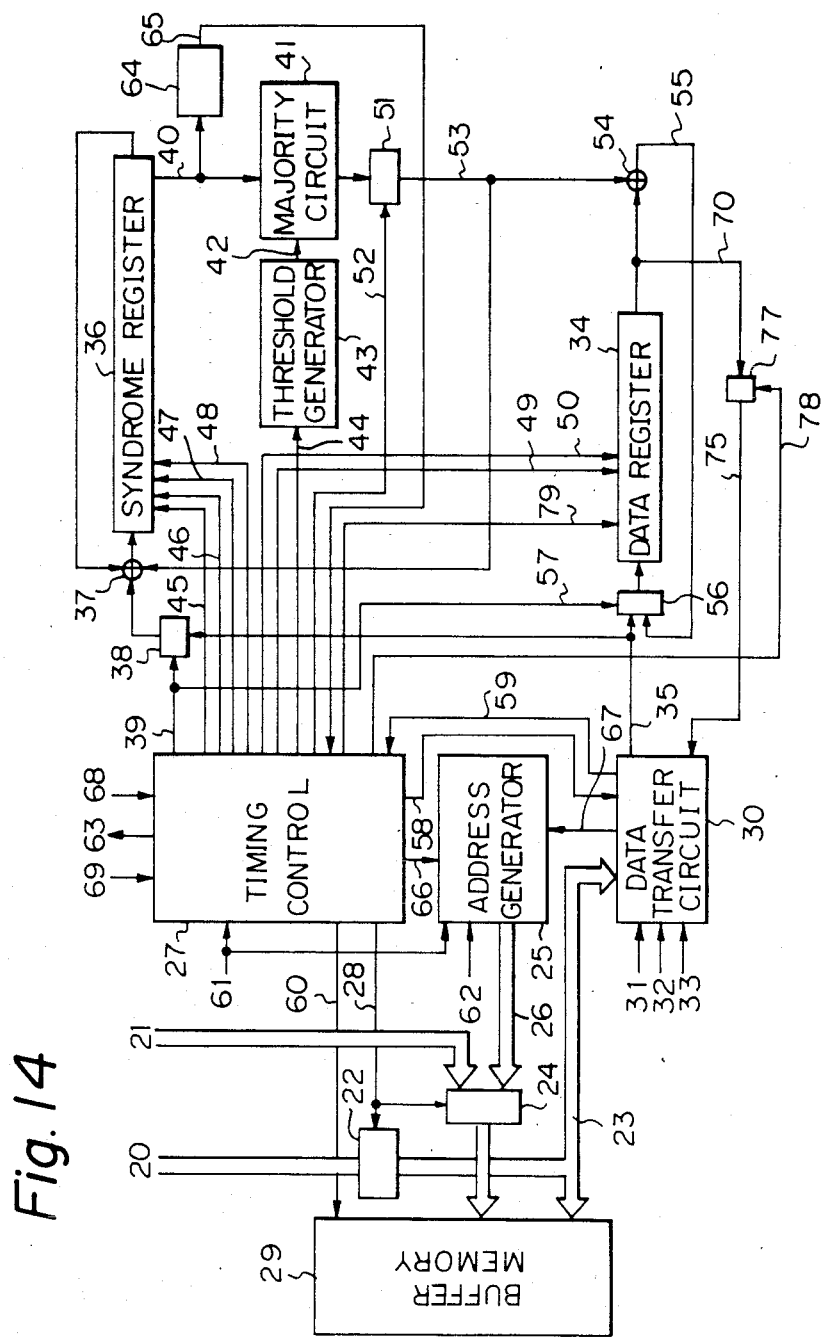
FIG. 14 is still another block diagram of an embodiment of the present invention.

FIG. 14 is the modification of FIG. 13. In FIG. 14, the numeral 70 is the 190'th bit output signal of the data register 34. The output gate circuit 77 controls if said correction end signal 70 is passed or not according to the output gate signal 78 from the timing control 27. The output 75 of the gate 77 is applied to the data transfer circuit 30. The numeral 79 is a clock signal similar to 76 in FIG. 13, but it provides 190 clocks irrespective of number of shortened bits (n).

Figure 15:
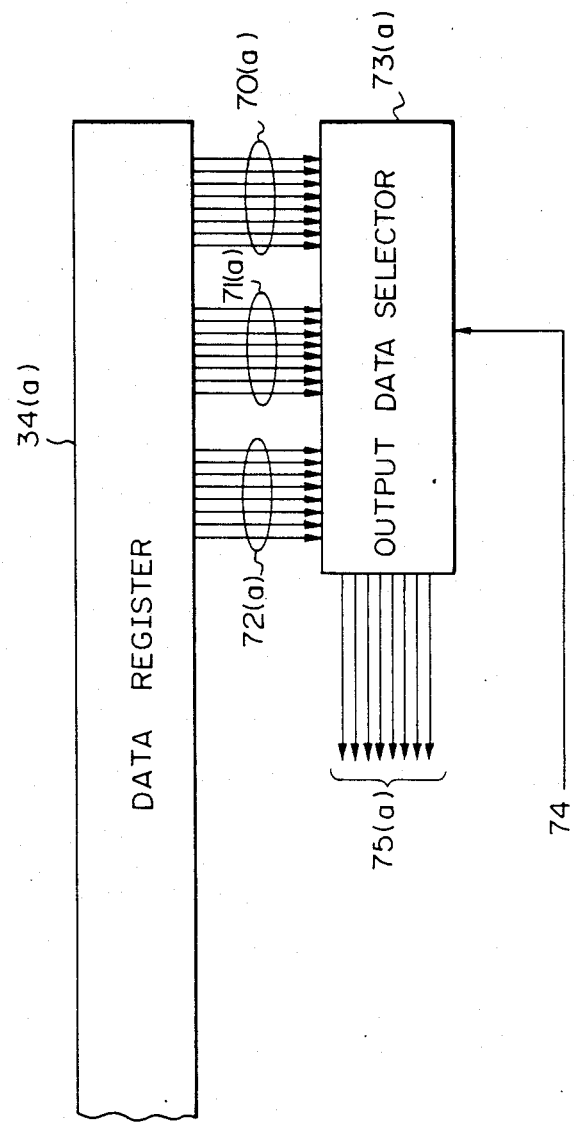
FIG. 15 is a block diagram of still another embodiment of the present invention.

FIG. 15 is a still another modification of FIG. 13. The modification of FIG. 15 takes 8 bits of correction end data, while the embodiments of FIGS. 13 and 14 take a correction end data of one bit. In FIG. 15, 70(a), 71(a), and 72(a) are output signals of $190-n$ bit position through $190-n-7$ bit position. So, each of 70(a), 71(a) and 72(a) has 8 bits. The output selection signal 74 selects one of 70(a), 71(a) and 72(a), and the selected correction output data 75(a) is applied to the data transfer circuit 30. As 8 bits of correction output data is provided, the operation and structure for serial-parallel conversion in the data transfer circuit are simplified. FIG. 15 shows the case that three kinds of bit reduction is possible by 70(a), 71(a) and 72(a), and it should be noted of course that two kinds of bit reduction and/or more than four kinds of bit reduction is possible.

Figure 16:
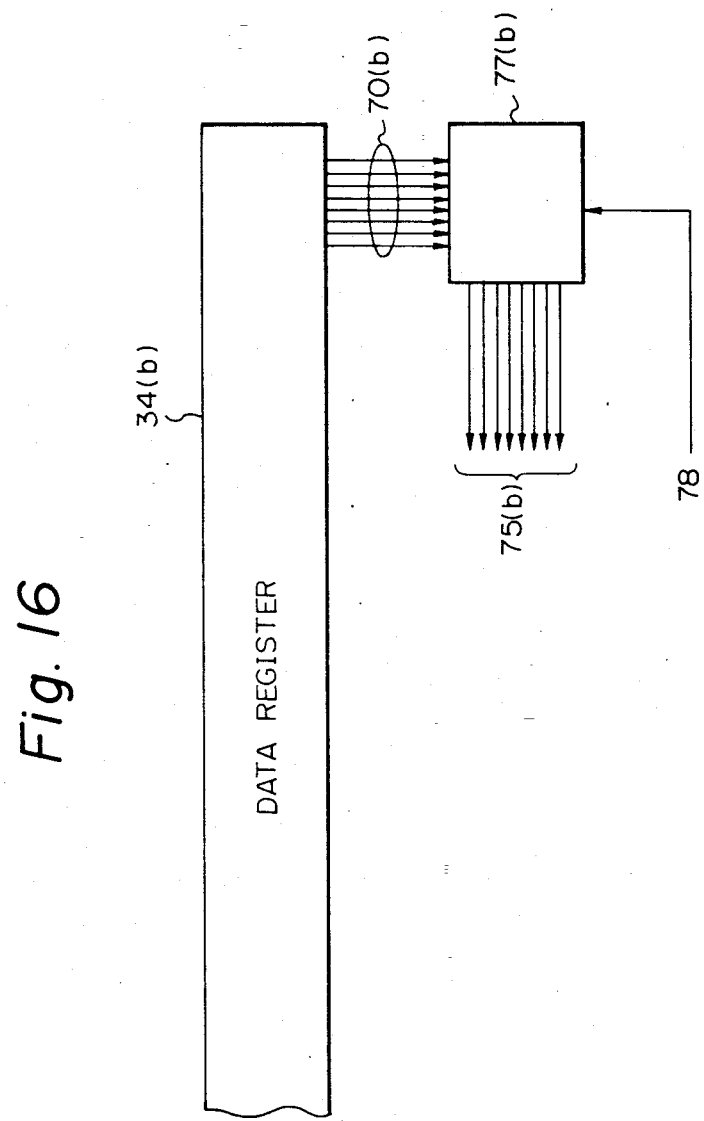
FIG. 16 is a block diagram of still another embodiment of the present invention.

FIG. 16 is a modification of FIG. 14. The modification of FIG. 16 takes 8 bits of correction end data from 190'th bit position through 183'th bit position. The numeral 78 is an output gate signal, which gates the signal 70(b) to provide an output 75(b) which is applied to the data transfer circuit 30. In this case, the operation and structure of the data transfer circuit 30 which performs serial-parallel conversion are simplified.

In FIGS. 15 and 16, 4 bits or 16 bits are of course handled simultaneously instead of 8 bits.

From the foregoing it will now be apparent that a new and improved error correction system has been discovered. It should be understood of course that the embodiments disclosed are merely illustrative and are not intended to limit the scope of the invention. Reference should be made to the appended claims, therefore, rather than the specification as indicating the scope of the invention.

What is claimed is:

1. An error correction system for a difference set cyclic code, comprising:
    a data transfer circuit which receives packets of data;
    an error correction circuit which includes a data register and a syndrome register, each of which receives data from the data transfer circuit, a majority circuit coupled to the syndrome register, and means for combining the output of the data register with an output obtained from the majority circuit to obtain corrected data;
    a timing control coupled to the data transfer circuit and the error correction circuit for providing timing signals for the error correction system; and
    an index register which receives and stores information as to whether or not a packet is to be corrected, said index register being operative to control application of packets to said error correction circuit in accordance with said stored information.

2. An error correction system according to claim 1 wherein said index register is operative to store correction flags indicative of packets to be corrected, only packets having correction flags being applied to said error correction circuit.

3. An error correction system according to claim 1 wherein received data packets are contained in frames, and further comprising a frame detect register means for producing a frame synchronization detect signal if frame synchronization has been established, and logic means for controlling application of packets to said error correction circuit in accordance with both the frame synchronization detect signal and the signal from said index register.

4. An error correction system for a difference set cyclic code, comprising:
    a data transfer circuit which receives packets of data contained in frames;
    an error correction circuit which includes a data register and a syndrome register, each of which receives data from the data transfer circuit, a majority circuit coupled to the syndrome register, and means for combining the output of the data register with an output obtained from the majority circuit to obtain corrected data;

a timing control coupled to the data transfer circuit and the error correction circuit for providing timing signals from the error correction system;

detection means for detecting if frame synchronization for each packet is established; and a register means which is set by said detection means and controls application of packets to said correction circuit.

5. An error correction system for a difference set cyclic code, comprising:

a buffer memory;

a data transfer circuit;

one or more data buses for coupling data between an external circuit, the buffer memory, and the data transfer circuit;

an error correction circuit which includes a data register and a syndrome register, each of which receives data from the data transfer circuit, a majority circuit coupled to the syndrome register, and means for combining the output of the data register with an output obtained from the majority circuit to obtain corrected data;

a timing control coupled to the buffer memory, data transfer circuit and error correction circuit for providing timing signals for the error correction system; and a mode control means also coupled to said timing control, said made control means being operative to control coupling of data to and from the error correction circuitry in one mode in which: data is coupled, to the buffer memory and then, via the data transfer circuit, to the error correction circuit and then back to the buffer memory; or in another mode in which: data is coupled from the external circuit, via the data transfer circuit, to the error correction circuit and then back to the external circuit.

6. An error correction system according to claim 5 further comprising a command register coupled with said timing control and an external CPU, and wherein said mode control means is further operative to control coupling of data to and from the error correction circuitry in a further mode which utilizes the buffer memory as in said one mode, but wherein correction is initiated via said command register.

7. An error correction system for difference set cyclic (L, k) code having k data bits and L−k parity bits comprising:

a data transfer circuit which receives data to be corrected;

an error correction circuit which includes a data register and a syndrome register, each of which receives data from the data transfer circuit, a majority circuit coupled to the syndrome register, and means for combining the output of the data register with an output obtained from the majority circuit to obtain corrected data;

a timing control coupled to the data transfer circuit and the error correction circuit for providing timing signals for the error correction system;

said syndrome register having L−k bits and said data register having m bits, where m is equal to or less than k;

designation input means for designating shortened data length of k−n bits, where n is an integer;

a load means for loading uncorrected data with k−n bits designated by said designation input means to said m bits data register; and an output data selection circuit for selecting one of the plurality of bit outputs of said data register of m bits according to output of said designation input means.

8. An error correction system for difference set cyclic (L,k) code having k data bits and L−k parity bits according to claim 7, wherein value L is 273, and value k is 191.

9. An error correction system for difference set cyclic (L,k) code having k data bits and L−k parity bits comprising:

a data transfer circuit which receives data to be corrected;

an error correction circuit which includes a data register and a syndrome register, each of which receives data from the data transfer circuit, a majority circuit coupled to the syndrome register, and means for combining the output of the data register with an output obtained from the majority circuit to obtain corrected data;

a timing control coupled to the data transfer circuit and the error correction circuit for providing timing signals for the error correction system;

said syndrome register having L−k bits and said data register having m bits, where m is equal to or less than k;

designation input means for designating shortened data length of k−n bits, where n is an integer;

a load means for loading uncorrected data with k−n bits designated by said designation input means to said m bits data register; and prohibit means for stopping said data register to output m bits of output data during m−(k−n) bit duration, when corrected data is provided by said data register.

10. An error correction system for difference set cyclic (L,k) code having k data bits and L−k parity bits according to claim 9, wherein value L is 273, and value k is 191.

11. An error correction system for difference set cyclic (L,k) code having k data bits and L−k parity bits comprising:

a data transfer circuit which receives data to be corrected;

an error correction circuit which includes a data register and a syndrome register, each of which receives data from the data transfer circuit, a majority circuit coupled to the syndrome register, and means for combining the output of the data register with an output obtained from the majority circuit to obtain corrected data;

a timing control coupled to the data transfer circuit and the error correction circuit for providing timing signals for the error correction system; and said syndrome register having L−k bits and said data register having m bits, where m is equal to or less than k;

designation input means for designating shortened data length of k−n bits, where n is an integer;

a load means for loading uncorrected data with k−n bits designated by said designation input means to said m bits data register; and an output data selection circuit for selecting one of plural outputs of said m bits data register, according to designation by said designation input means.

12. An error correction system for difference set cyclic (L,k) code having k data bits and L−k parity bits according to claim 11, wherein value L is 273, and value k is 191.

* * * * *